United States Patent
Hauenstein

(10) Patent No.: US 8,368,210 B2
(45) Date of Patent: Feb. 5, 2013

(54) WAFER SCALE PACKAGE FOR HIGH POWER DEVICES

(75) Inventor: Henning M. Hauenstein, Redondo Beach, CA (US)

(73) Assignee: International Rectifier Corporation, El Segundo, CA (US)

(*) Notice: Subject to any disclaimer, the term of this patent is extended or adjusted under 35 U.S.C. 154(b) by 0 days.

(21) Appl. No.: 13/225,987

(22) Filed: Sep. 6, 2011

(65) Prior Publication Data

US 2011/0316086 A1    Dec. 29, 2011

Related U.S. Application Data

(62) Division of application No. 11/641,270, filed on Dec. 19, 2006, now Pat. No. 8,018,056.

(60) Provisional application No. 60/753,353, filed on Dec. 21, 2005, provisional application No. 60/756,984, filed on Jan. 6, 2006, provisional application No. 60/761,722, filed on Jan. 24, 2006.

(51) Int. Cl.
  *H01L 23/34*    (2006.01)

(52) U.S. Cl. .................................. 257/724; 257/723
(58) Field of Classification Search .................. 257/723, 257/724, 704, 730, 731, 728, 699
See application file for complete search history.

(56) References Cited

U.S. PATENT DOCUMENTS

| | | | |
|---|---|---|---|
| 6,503,780 B1 * | 1/2003 | Glenn et al. | 438/116 |
| 6,617,197 B1 * | 9/2003 | Bayan et al. | 438/112 |
| 6,624,522 B2 * | 9/2003 | Standing et al. | 257/782 |
| 7,923,349 B2 * | 4/2011 | McElrea et al. | 438/460 |
| 2007/0036932 A1 * | 2/2007 | Kirby et al. | 428/40.1 |

* cited by examiner

*Primary Examiner* — Sheila V Clark
(74) *Attorney, Agent, or Firm* — Farjami & Farjami LLP

(57) ABSTRACT

A semiconductor device package is formed of DBC in which thinned MOSgated and/or diode die are soldered to the bottom of an etched depression in the upper conductive layer. A via in the insulation layer of the DBC is filled with a conductive material to form a resistive shunt. Plural packages may be formed in a DBC card and may be separated individually or in clusters. The individual packages are mounted in various arrays on a support DBC board and heat sink. Integrated circuits may be mounted on the assembly and connected to the die for control of the die conduction.

11 Claims, 21 Drawing Sheets

3A

3B

WAFER SCALE PACKAGE FOR HIGH POWER DEVICES

This is a divisional of application Ser. No. 11/641,270 filed Dec. 19, 2006 now U.S. Pat. No. 8,018,056.

RELATED APPLICATIONS

The present application is based on and claims benefit of U.S. Provisional Application No. 60/753,353, filed Dec. 21, 2005, entitled BOND-WIRELESS HIGH POWER DENSITY MODULE WITH INTEGRATED SMARTNESS (IR-3174 Prov); U.S. Provisional Application No. 60/756,984, filed Jan. 6, 2006, entitled BOND-WIRELESS POWER PACKAGE WITH INTEGRATED CURRENT SENSOR, ESPECIALLY SHORT CIRCUIT PROTECTION (IR-3175 Prov); and Provisional Application No. 60/761,722, filed Jan. 24, 2006, entitled STRESS-REDUCED BOND-WIRELESS PACKAGE FOR HIGH POWER DENSITY DEVICES (IR-3177 Prov), to all of which a claim of priority is hereby made and the disclosure of which is incorporated by reference.

FIELD OF THE INVENTION

This invention relates to semiconductor device packages and to processes for their manufacture.

BACKGROUND OF THE INVENTION

The power and current carrying capabilities of power switches such as MOSFETs and IGBTs are commonly limited by their package. Thus, the package introduces thermal and electrical resistance that can cause power loss and corresponding heating of the semiconductor die beyond its specified limits.

Beside the thermal issues, package inductivity is also an important limiting factor for switching high currents. Parasitic package inductance causes inductive over-voltage that can destroy the die. Such die may be silicon or GaN based die. This is especially true for state-of the art packaging technologies using bond wires for the electrical connection of the top-metals of the die to a lead frame or other external metal terminals. In order to take the inductive overvoltage into account the die used often must have a much higher breakdown voltage then the application itself would require.

Therefore, packaging technologies try to achieve low inductivity and better thermal connectivity to a heatsink by bond wireless connection techniques for the power devices. One example of such an approach is the DirectFET technology shown, for example, in U.S. Pat. No. 6,624,522 (IR-1830). By connecting the topside of the power die particularly the source or the emitter contact of a MOSgated device to a larger metal area, the package gains a higher current carrying capability, better thermal properties and a lower inductivity at the same time. (The top power electrode with hereinafter frequently be referred to as the source for both MOSFETs and IGBTs.) Other techniques use flip-chip soldering of the device or large metal straps are soldered on top of the die (source or emitter contact) in order to improve the thermal and electrical behavior of the device.

A major problem of large metal contacts or copper straps is the stress on the die due to the higher thermal expansion coefficient of metal compared to that of the die, such as a silicon based die. This may be acceptable in relatively moderate power applications as in consumer electronics but it creates a severe reliability issue for heavy duty applications in a harsh environment like those of automotive electronics. The stress effect in such extreme applications can cause major damage to the sensitive top metal layers of the die due to the active layers underneath.

Besides the introduced stress on the die, large metal contacts such as those used in a copper strap device or in the DirectFET device can metal, can have another disadvantage on the long term behavior of the package. Thus, the solder joint between the die and the metal contact tends to deteriorate rapidly if major temperature changes and cycling are applied. This failure mechanism is also driven by the thermal mismatch and the different thermal expansion of the metal contact vs. the die material. This results in micro cracks and even de-lamination of the contact, causing an increase of thermal and electrical resistance within the solder joint. Consequently, the package performance will be impacted.

Therefore the metal can of the DirectFET device uses an adhesive layer rather than a solder for the die attach of the backside of the die to the interior of the metal can in order to compensate the thermal expansion mismatch between die and metal can. Adhesives can deal better with stress induced forces and do not deteriorate like solder due to their higher flexibility. However, an adhesive or glue layer has limited current carrying capability and a higher thermal resistance as compared to solder.

Due to the above described thermal mismatch problems high power packages commonly use substrates like Direct-Bonded-Copper (DBC), which offers a better match of the thermal expansion coefficient to die substrates such as silicon. A DBC substrate generally comprises a central insulation layer, frequently a ceramic which has top and bottom conductive layers on its top and bottom surfaces. These are frequently copper. The top layer may be patterned as desired. This technology is normally used by soldering one side of a die to the top conductive layer of DBC while the other side is contacted via conventional wire bonds. As far as cooling is concerned, only one side of the die is cooled, while the other side suffers from the thermal bottleneck of the wirebonds. Further, the inductance is relatively high due to the wirebonds. Therefore, while DBC-substrate technology on one die side only solves the reliability problem, does not offer the best thermal and low-inductance performance.

It is known to use two DBC substrates, forming a sandwich of a top and a bottom DBC substrate and central die. The DBC substrates are relatively large since they also provide the whole circuitry for the power modules such as half-bridge-, H-bridge- or full-bridge configurations. Bare die are soldered between the top and bottom DBC. Bond-wireless die attach, low inductivity and both-sided cooling is thus addressed. The main disadvantage of these structures is the high cost of using two highly customized DBC substrates (since they provide the circuitry) which have to be extremely precise and flat since several bare die of a thickness of 100-300 μm need to be contacted between the substrates. This requires extreme precision which is a major challenge for production. Therefore, the high costs and manufacturing challenges for such a DBC sandwich technology are major obstacles for this technique.

A further disadvantage of the prior art packages described above is the difficulty of adding current sensing and over current sensing functions to the package. Thus, it is known to implement current measurement sensors into the application of such packages. These sensors allow a protection circuit to detect dangerous current limits and start countermeasures such as shutting down a system, limiting the current, running the application at lower performance by derating current or voltage and the like. These current sensors are normally resistors which are mounted in a current path of the application. Such current sensors introduce additional costs and need mounting space. Current sensing capabilities can also be added to the power device itself. Thus, current sense are known MOSFETs in which a small part of the current carrying area of the die is used to measure the current flow and determine, via calibration techniques which are well known, the corresponding full current through the full active area of the device. The disadvantages of this method are:

it needs additional space on the die;
it is relatively inaccurate, and especially;
it requires a special die design/layout.

Another disadvantage regarding packaging of such current sensing power devices is that the current sense function needs at least two more contact pads which deliver a voltage signal proportional to the main current flow. These contacts are normally small low power pads connected via wire bonds to the external circuitry. Those contact pads reduce the available die surface further. Thus, the bond wireless power package becomes much more complex since two more small contacts need to be contacted, and bumping of the die becomes more complicated, too.

Another further disadvantage is the difficulty of testing/probing of die with integrated current sense functions. The current sense option adds test time and can reduce the yield of the wafer to due failures of the current sense cells.

However, motor drives, DC/AC—inverter or DC/DC converters using power switches in a half-, full- or H-bridge configuration need to measure and control the current very precisely. It is important that the corresponding control units get a precise feedback of the main current (e.g. the phase currents in a motor drive application). For these purposes sensors with relatively high accuracy are required (often over a large dynamic range). It is therefor to use highly precise shunt resistors, hall-sensors, magneto resistive sensors, and the like for this kind of current sensing.

SUMMARY OF THE INVENTION

In accordance with the invention a novel high current package is formed in which a depression formed in the top copper layer forms a "case" to receive a thinned semiconductor die such as a MOSFET or IGBT or the like. The drain contact (drain and collector electrodes are interchangably used herein) is soldered to the surface of the depression and the top surface of the die is approximately coplanar with the rim of the depression. Solderable source (or emitter) and gate pads or corresponding solder bumps project above the plane at the rim. The die can also be flipped and mounted with the source (emitter) electrode soldered to the depression bottom. The rim around the depression may be shaped as a horse shoe (or U-shaped) or can have any desired shape with or without an interrupted rim.

One or more such packages can be mounted on a heat sink, and plural packages may share a common central insulation layer. The packages can be formed at the DBC card level and can be singulated individually or in integral groups of packages.

A top heat sink may be connected to the top copper layer of one or more packages to provide top side and thus dual side cooling.

One or more conductive vias may be formed through the DBC insulation layer to permit connection of top die electrodes to the bottom DBC copper layer to act as a resistive current shunt. An integrated circuit control structure can be connected to the top of such packages for the control of the devices in the circuits containing them.

The invention offers the following advantages:
a) improved mechanical properties:
   i) stress-reduced both-sided cooled semiconductor device housing
   ii) material selection with thermally matching expansion coefficients to silicon die
   iii) increased reliability due to matching thermal expansion coefficients
b) improved electrical and thermal properties:
   i) low inductance by providing a large contact area for source and drain (or emitter/collector) of the die
   ii) excellent current power capability due to low electrical and thermal resistance using solder die attach and large contact areas
   iii) electrical isolation (needed in high voltage and automotive and other applications)
c) improved manufacturing and handling properties
   i) pre-assembled discrete component package(s) suitable for easy handling and integration into power modules
   ii) less severe precision requirements for the DBC
d) low manufacturing and test costs due to:
   i) a high volume production without application specific customization, which can be done by the end-customer
   ii) die attach to the DBC can depression can be done on a DBC-card instead of handling and assembling discrete die
   iii) electrical/parametric end-tests after or during assembly can be done at DBC-card level before separating the packaged parts into discrete devices
   iv) transportation to the end-customer can be done by using a DBC-card-assembly as a whole which offers protection without the need for a sophisticated additional transport package
e) unique customer advantages:
   i) the pre-assembled discrete component package matches the thermal expansion coefficient of known power substrates and therefore is attractive for a large variety of applications
   ii) application-flexibility of the packaged discrete devices which can easily be combined to an application specific circuitry by the end-customer
   iii) application-flexibility due to various die attach possibilities inside of the DBC-can such as like up-side down or bottom up, providing optimum low- and high-side driver or half-/full-bridge configurations just by combining several DBC-can packaged die on a power substrate or in a power module
   iv) cost-effective material choice by matching the ceramic type of the DBC-can to the application requirements (e.g. $Al_2O_3$; AlN; SiN; and other ceramics)
f) unique easy implementation of optional features:
   i) an additional EMI screening function is available using the top-Cu layer of the DBC-can
   ii) an additional heat-spreader can be mounted on top of the DBC-can while the bottom of the die is soldered to the cooled power substrate of the application giving highly efficient double sided cooling for highest power densities
   iii) easy contact or integration of "intelligent devices" such as a gate-driver IC directly on top of the die package
   iv) easy implementation of contact terminals for external electrical interfaces such as power and signal leadframes
g) application benefits:
   i) Due to the above described high flexibility of use and due to different available options, the invention will be able to cover a broad bandwidth of applications in the power management market.

ii) The main application field will be in high power circuits and modules switching high currents or high voltages and requiring low inductance and EMI-screening. Especially relevant are high power density applications using MOSFETs and IGBTs and applications under harsh environmental conditions or difficult temperature cycling requirements like automotive or safety critical functions with high reliability requirements.

DETAILED DESCRIPTION OF THE PREFERRED EMBODIMENTS

Figure 1:
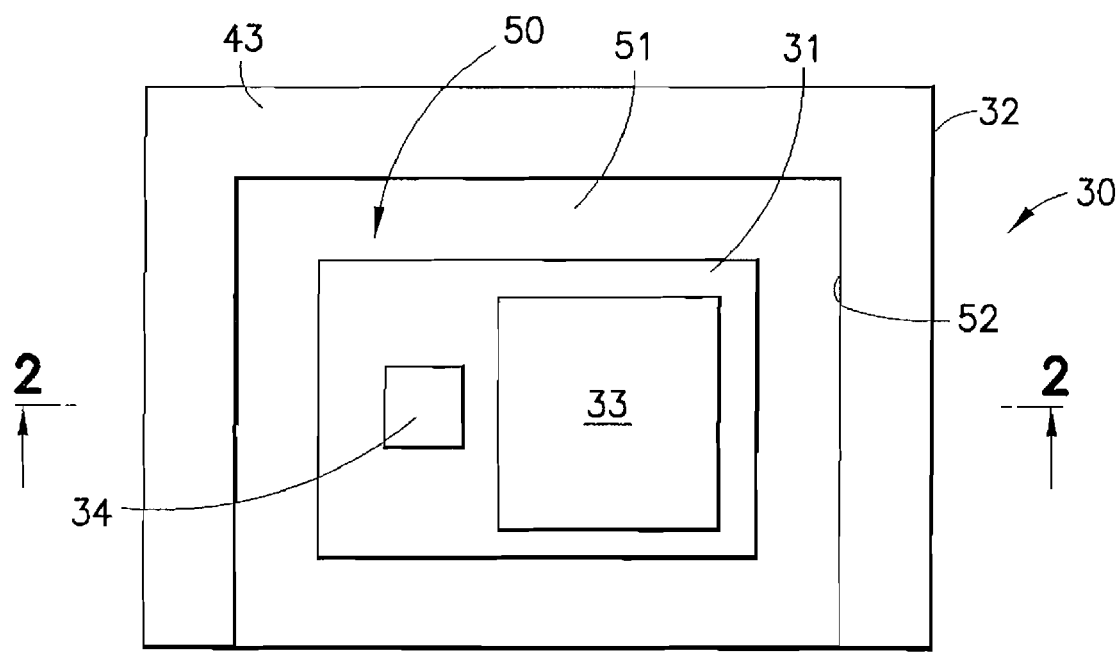
FIG. 1 is a top view of a package of the invention.
Figure 2:
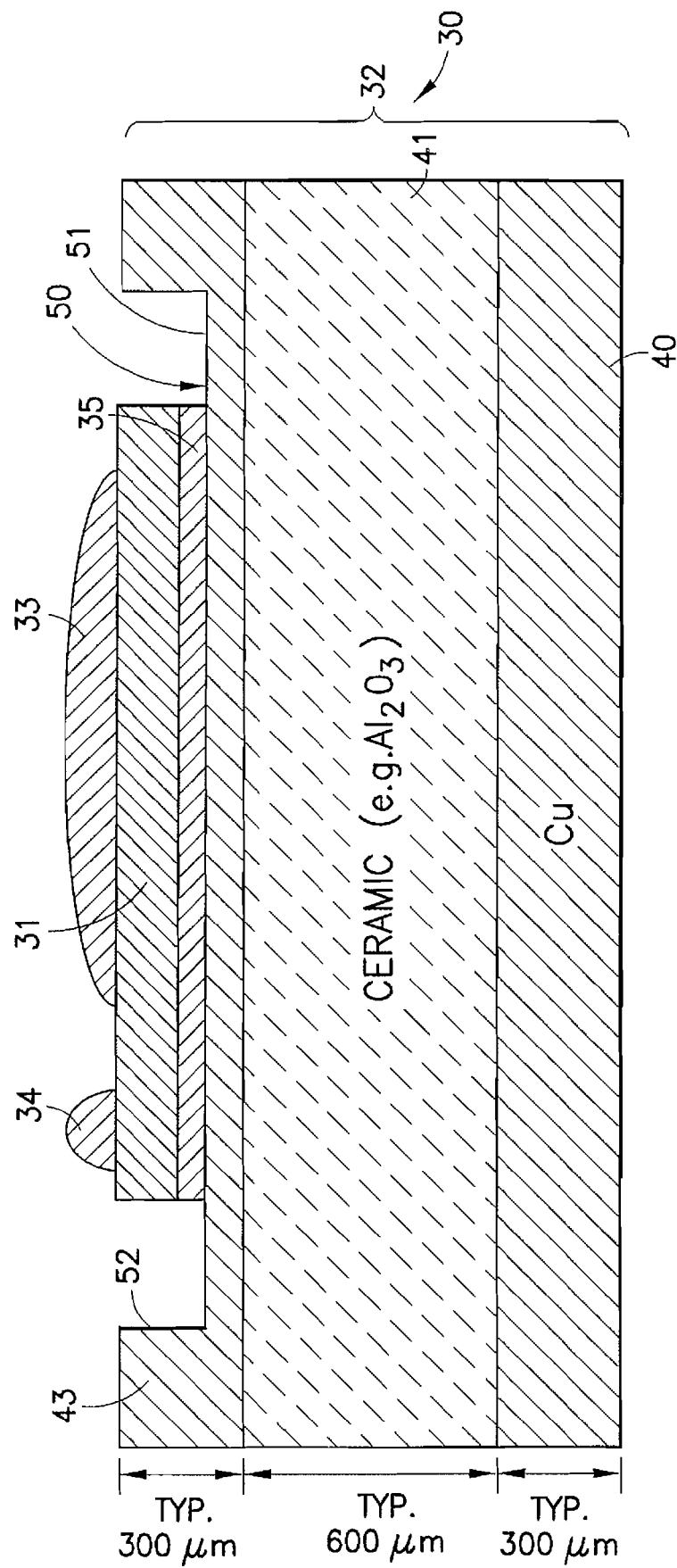
FIG. 2 is a cross-section of FIG. 1 taken across section line 2-2 in FIG. 1.
Figure 3:
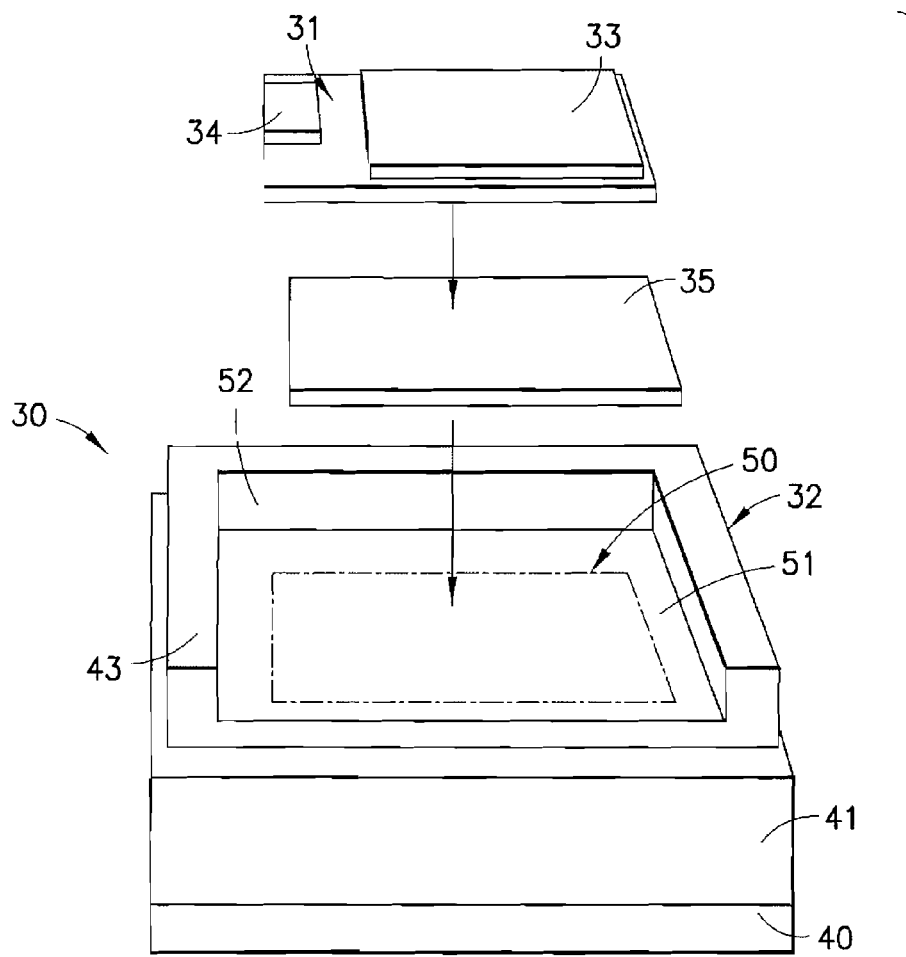
FIG. 3 is an exploded perspective view of FIGS. 1 and 2 and shows alternate orientations for the semiconductor die of the package.
Figure 3:
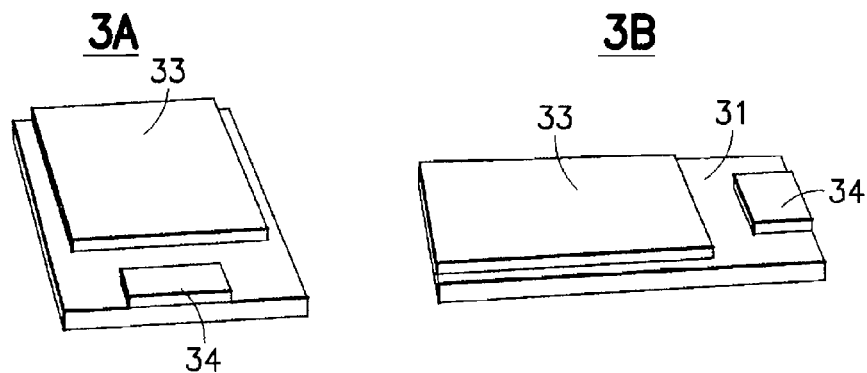

FIGS. 1, 2 and 3 show a first embodiment of the semiconductor device 30 of the invention. The semiconductor device 30 comprises a semiconductor die 31 and a housing 32.

Semiconductor die 31 may be a silicon based vertical conduction power MOSFET having, on one surface, a source electrode which receives a solder bump 33, a gate electrode which receives a solder bump 34 and, on its opposite surface, a drain electrode which receives solder preform 35. It should be noted that solderable metal pads can be used in place of the solder bumps and solder paste can be used in place of the solder preform. While die 31 is shown as a silicon die, it may be of any type of semiconductor material including Gallium Nitride based devices, silicon carbide devices and the like. Further, while die 31 is described as a power MOSFET, it can be any type of semiconductor device, including a bipolar transistor die, an IGBT die, a break over device die, a diode die and the like. The term MOSgated device is intended to refer to any type of semiconductor switching device with power electrodes on at least one surface thereof and a gate to switch the device between on and off conditions. The terms source electrode or source contact are intended to identify the source of a MOSFET or the emitter of any IGBT. Similarly, the terms drain electrode or contact and collector electrode or contact are intended to be interchangably used.

The housing 32 used with the invention may be a wafer consisting of a bottom conductive layer 40 which is bonded to an insulation layer 41 at its bottom surface, and a top conductive layer 43 which is bonded to the insulation layer at its top. This type of structure is referred to as "DBC". In accordance with the invention, top conductive layer 43 is patterned to have a depression 50 etched or otherwise formed therein and having a flat bottom surface 51 at least partly surrounded by a rim 52. The surfaces of depression 51 and rim 52 may be plated, for example, nickel plated to optimize solder wetting and to passivate the can against oxidation, and to increase reliability by changing the intermetallic between solder and the copper and the silicon or other material of the die to be soldered to surface 51.

The conductive materials used for conductive layers 40 and 43 may be any high conductivity metal, such as, and preferably copper, although other metals can be used. The center layer 41 may be any good electrical insulation to insulate layers 40 and 43 from one another and could be a ceramic, preferably $Al_2O_3$. As further examples, AlN and SiN may also be used. The layers 40 and 43 may be of any desired thickness, typically 300 µm but can have any other desired thickness, typically between 300 to 600 µm. Such DBC materials are commercially available and are commonly used in semiconductor device modules where copper layers 40 and 43 are to be electrically insulated, but in thermal communication so heat generated in one layer can flow through the insulation barrier 41 to the other conductive layer.

In accordance with the invention, the depression 51 will have a depth sufficient to receive solder layer 35 which typically may be less than about 100 µm thick and die 31 which typically may be thinned to less than about 100 µm. In the example of FIG. 1, the die is 70 µm thick and the solder 35 is about 100 µm thick, leaving a web of copper 130 µm thick between surface 51 and the top surface of insulation layer 41.

Die 31 is appropriately soldered to the surface 50 of depression 50 with the top surface of die 31 at least approximately coplanar with the top of rim 52. Solder bumps 33 and 34 project above this plane so that the package can be inverted and the contact bumps soldered to traces on a circuit board without need for wire bonds. Alternatively, solderable pads can be used in place of the solder bumps for later solder attach. Heat generated at die 31 during its operation is conducted through ceramic 41 to the copper layer 40 which can dissipate heat from the package and, in particular, can be thermally connected to a heat sink which will be electrically insulated from the drain 35 and conductive layer 40.

While a relatively large gap is shown between the outer periphery of die 31 and the inner surface of rim 52, this space can be reduced to the smallest dimension consistent with manufacturing ease and convenience. Further, the remaining gap may be filled with an insulation bead.

FIG. 3 schematically shows two other possibly orientations for die 31 at locations 3A and 3B.

Figure 4:
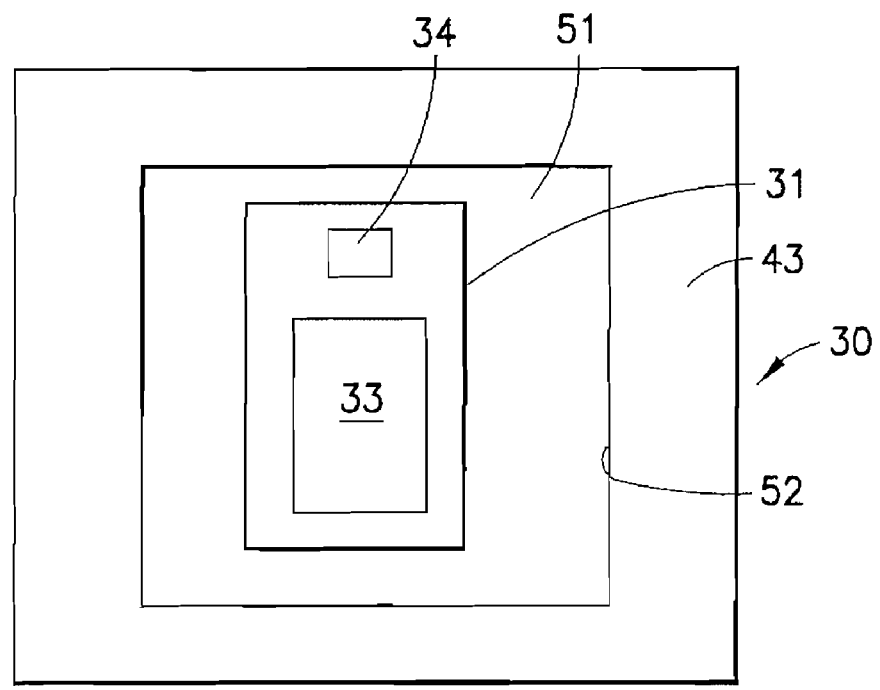
FIGS. 4 and 4A are a top view of an alternative structures for the package of the invention.
Figure 4A:
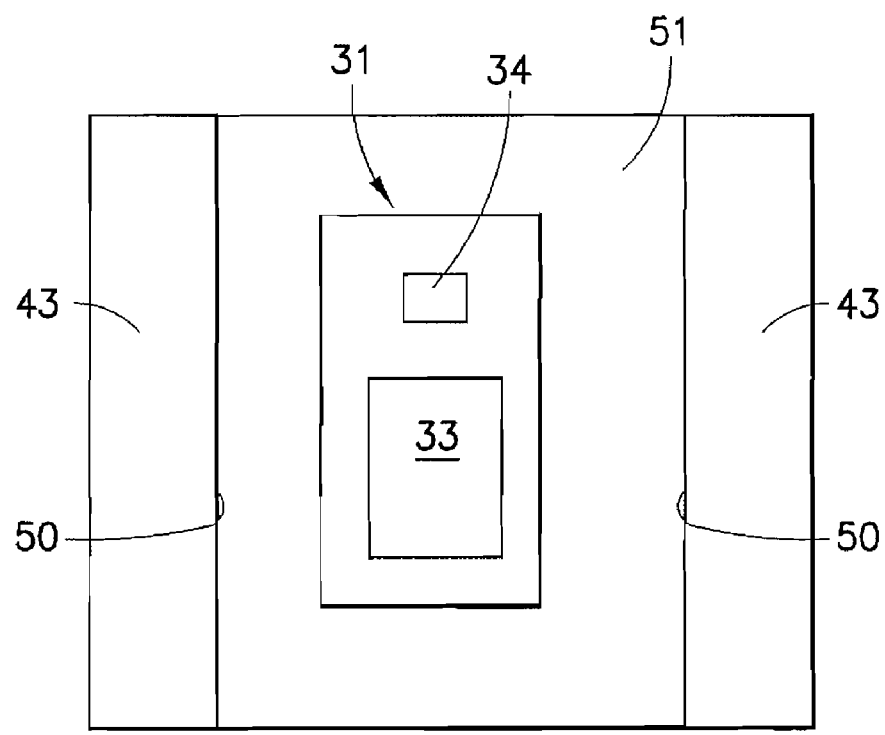

The rim 52 of copper layer 43 is shown to be a horse shoe or U-shape in FIGS. 1, 2 and 3. Other configurations can be used. For example, in FIG. 4, where components similar to those of FIGS. 1, 2 and 3 have the same identifying numerals, the depression 51 in layer 43 is completely enclosed by a rim 50. FIG. 4A shows another embodiment in which both ends of the rim 43 are removed or opened to simplify contact to the gate and source contacts 34 and 33 respectively. Further, in the embodiment of FIG. 4A, air inclusion is less likely to occur during molding or gel filling.

Figure 5:
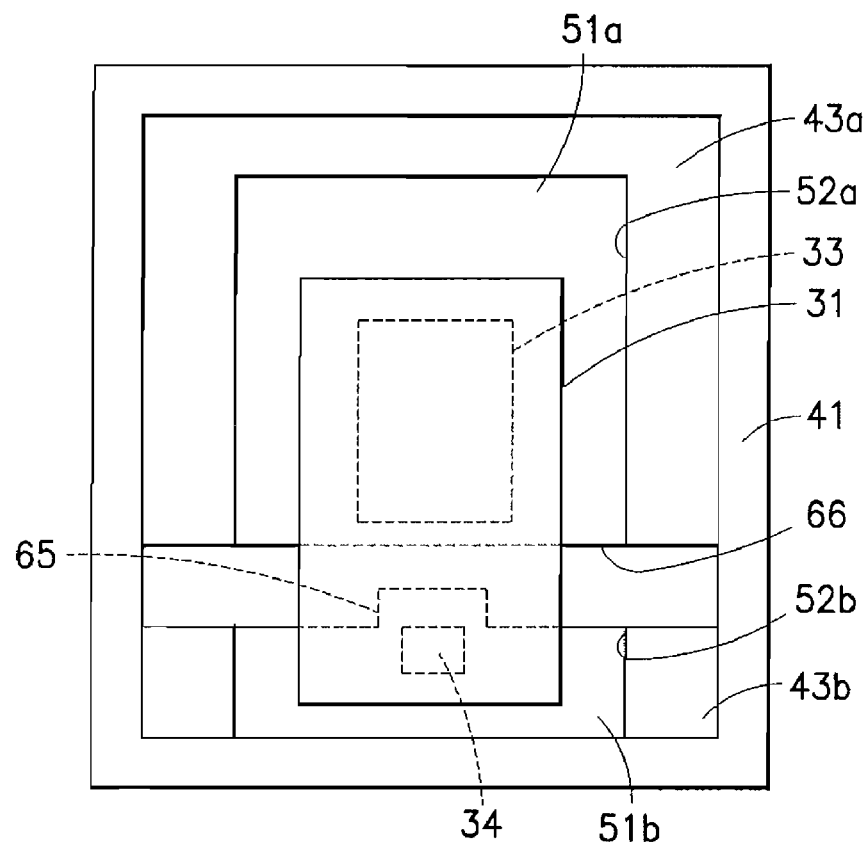
FIG. 5 is a top view of a further alternative of the package of FIGS. 1, 2 and 3 in which the die is inverted.
Figure 6:
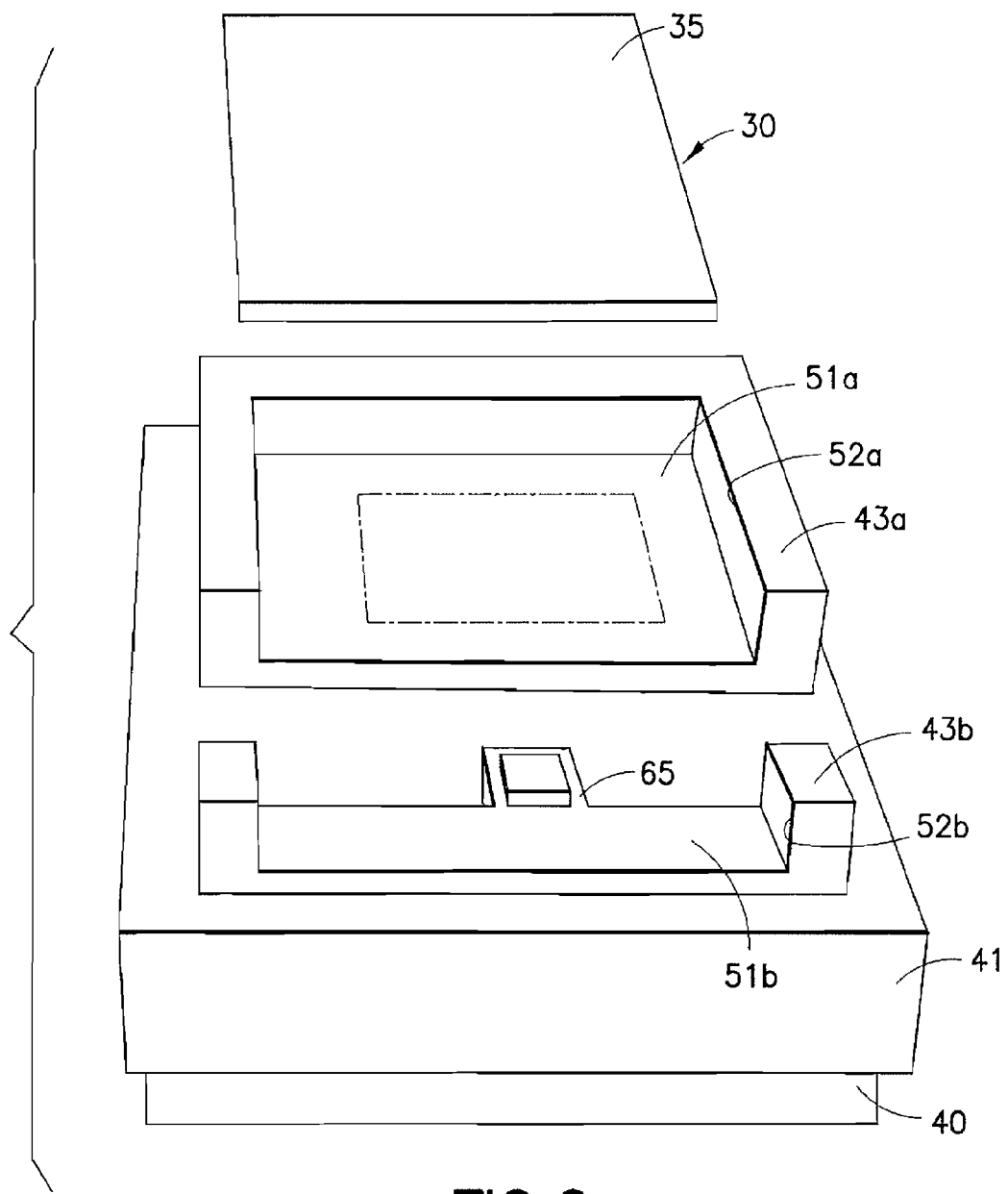
FIG. 6 is an exploded perspective view of the embodiment of FIG. 5.

FIGS. 5 and 6 show another embodiment of the invention and as will be the case hereinafter with all drawings, the same number identifies similar components. FIGS. 5 and 6 show the die 31 of FIGS. 1 to 4 flipped over so that the source and gate bumps (or the equivalent bumps of an IGBT or the like) face the depressed flat surface 51. Thus, in FIGS. 5 and 6, the upper copper layer 43 of FIGS. 1 to 4 is separated into segments 43a and 43b with respective rim segments 52a and 52b and flat depression base portions 51a and 51b. A short tongue 65 extends from depression body 51b. The flipped die 31 may then be soldered with source bump 33 soldered to surface 51a and gate bump 34 soldered to surface 51b and insulted from source bump 33 by the gap 66 in top conductive layer 43a-43b.

Figure 7:
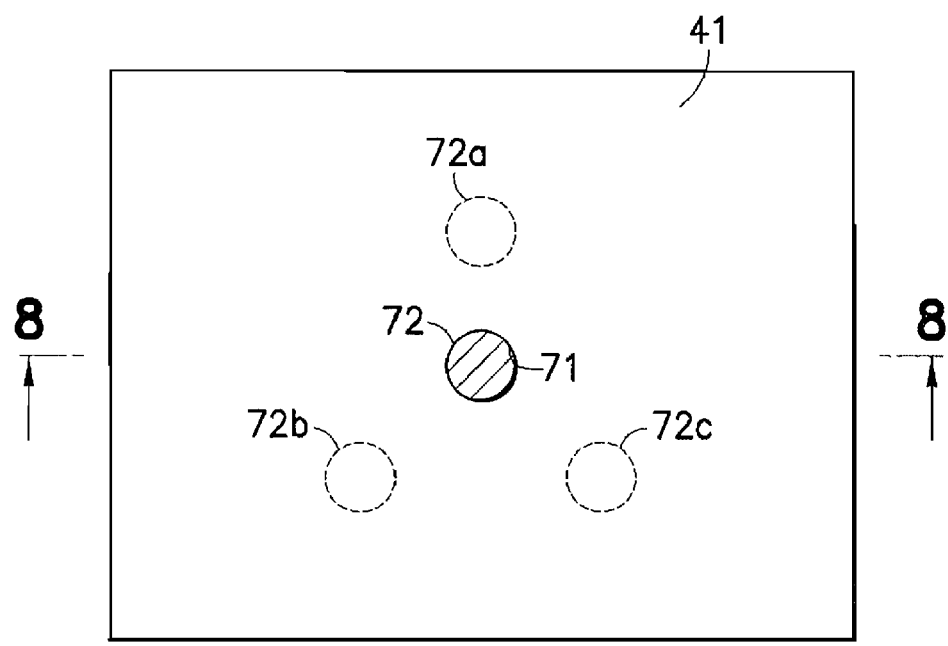
FIG. 7 is a top view of a further embodiment of the invention in which a resistive shunt via is formed in the DBC substrate.
Figure 8:
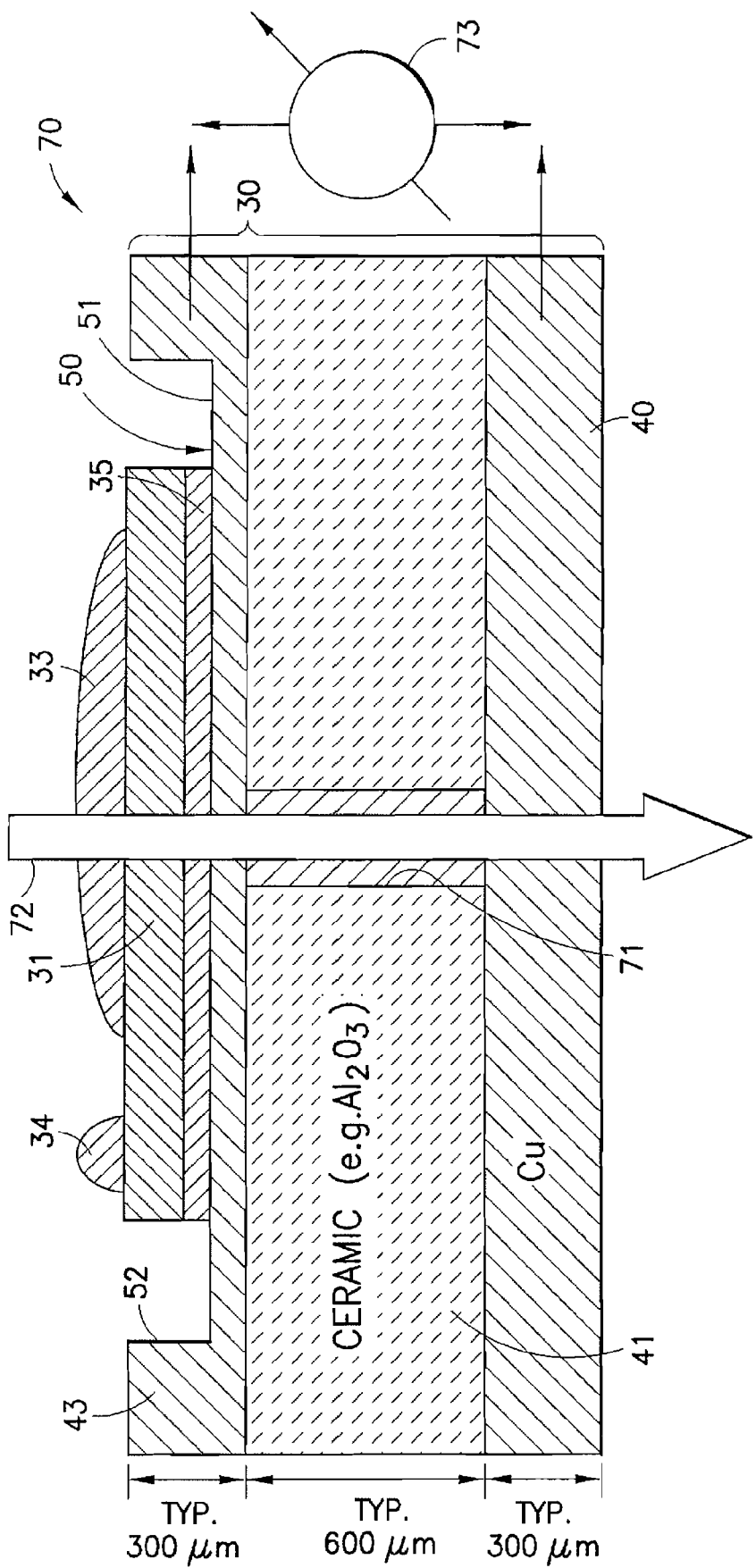
FIG. 8 is a cross-section of FIG. 7, taken across section line 8-8 in FIG. 7 and further shows a MOSFET die in the depression in the upper copper layer of the DBC wafer.

FIGS. 7 and 8 show a further embodiment of the invention in which at least one resistive current shunt is formed in package 70 (FIG. 8). Thus, the insulation layer 41 in FIG. 7 has a thru-opening 71 drilled or otherwise formed before copper layers 40 and 43 are bonded thereto. The thru-opening 71 can also be formed after the layers 40 and 43 are bonded to insulation 41. A suitable electrically conductive material 72 (FIG. 8) then fills the opening 71 to connect layers 40 and 43 and to form shunt resistor.

The required shunt resistance depends on the application and can be sized at greater than about desired 0.1 mohm although any resistance value can be created. The value of the shunt resistance will be a compromise between the acceptable power loss within the shunt and the voltage drop 73 across the shunt resistor 72. Note that the shunt 72 is integrated into the thermal path of the package 70 and will be automatically cooled by the heat sink or other thermal management cooling for the die 31.

The resistance of shunt 72 will depend on the geometry and length of thru hole 71 and the resistivity of the shunt material 72. The hole 71 is shown with a circular cross-section, but it could have any other shape. Its length will be that of the thickness of insulation layer, which, when a ceramic such as $Al_2O_3$ will be from 300 µm to 600 µm.

The material used for shunt 72 may be any desired conductor, for example, copper or solder, or may be materials such as manganin which have a relatively lower thermal coefficient of resistance. Plural parallel shunts equally or symmetrically distributed over the surface of the insulation layer 21 may also be used, shown in FIG. 7 by dotted circles 72a, 72b, 72c which will be under the relevant die electrode. This offers the advantage of lower inductance, higher shunt current and more equal shunt current distribution.

Figure 9:
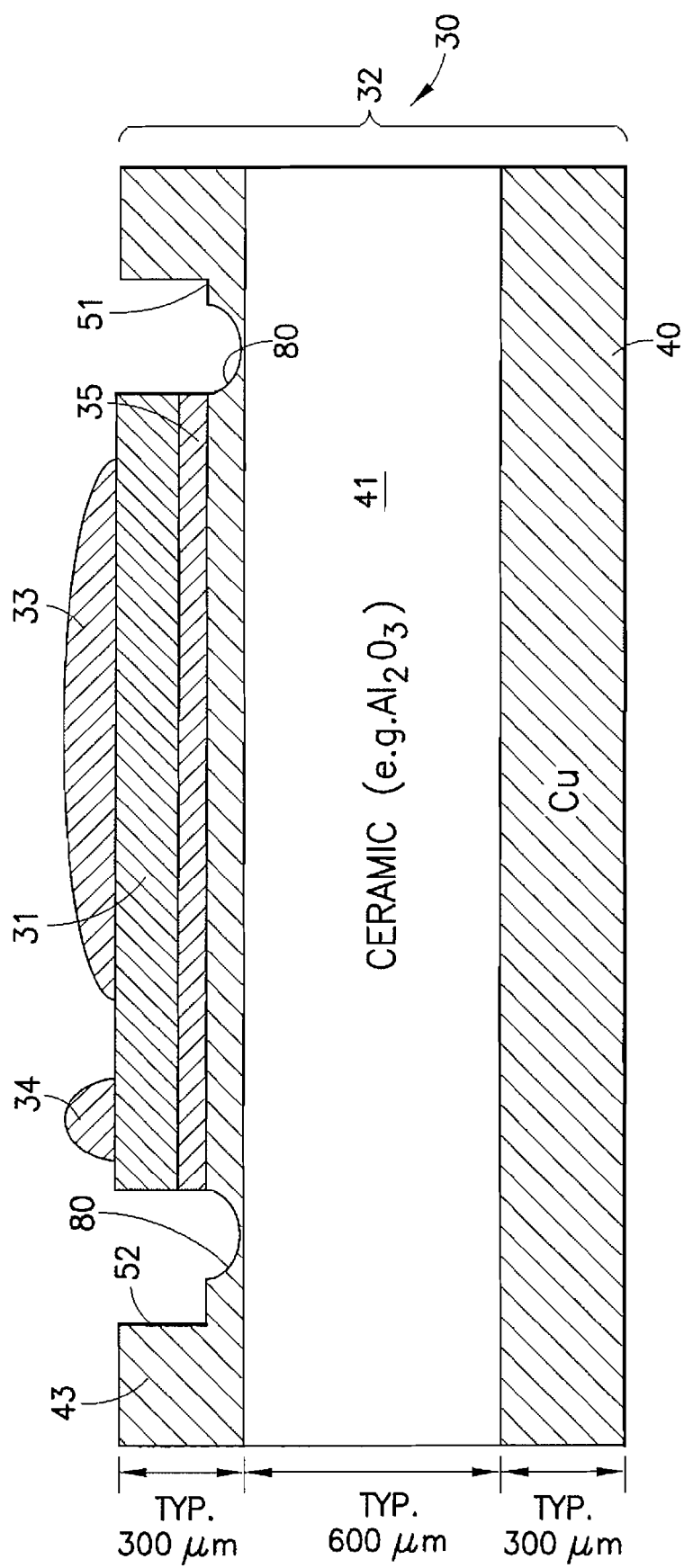
FIG. 9 is a cross section of the package of the invention, like that of FIG. 2, but further containing solder stop dimples to position the die during solder reflow.
Figure 10:
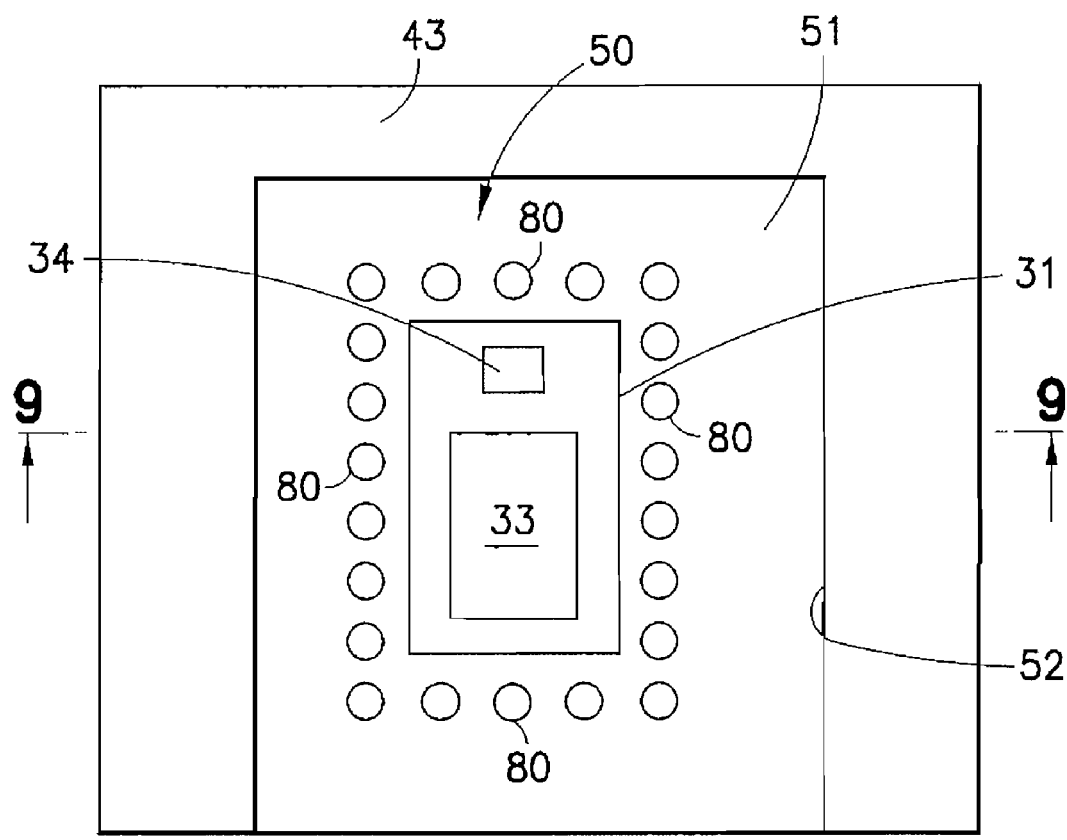
FIG. 10 is a top view of FIG. 9.
Figure 11:
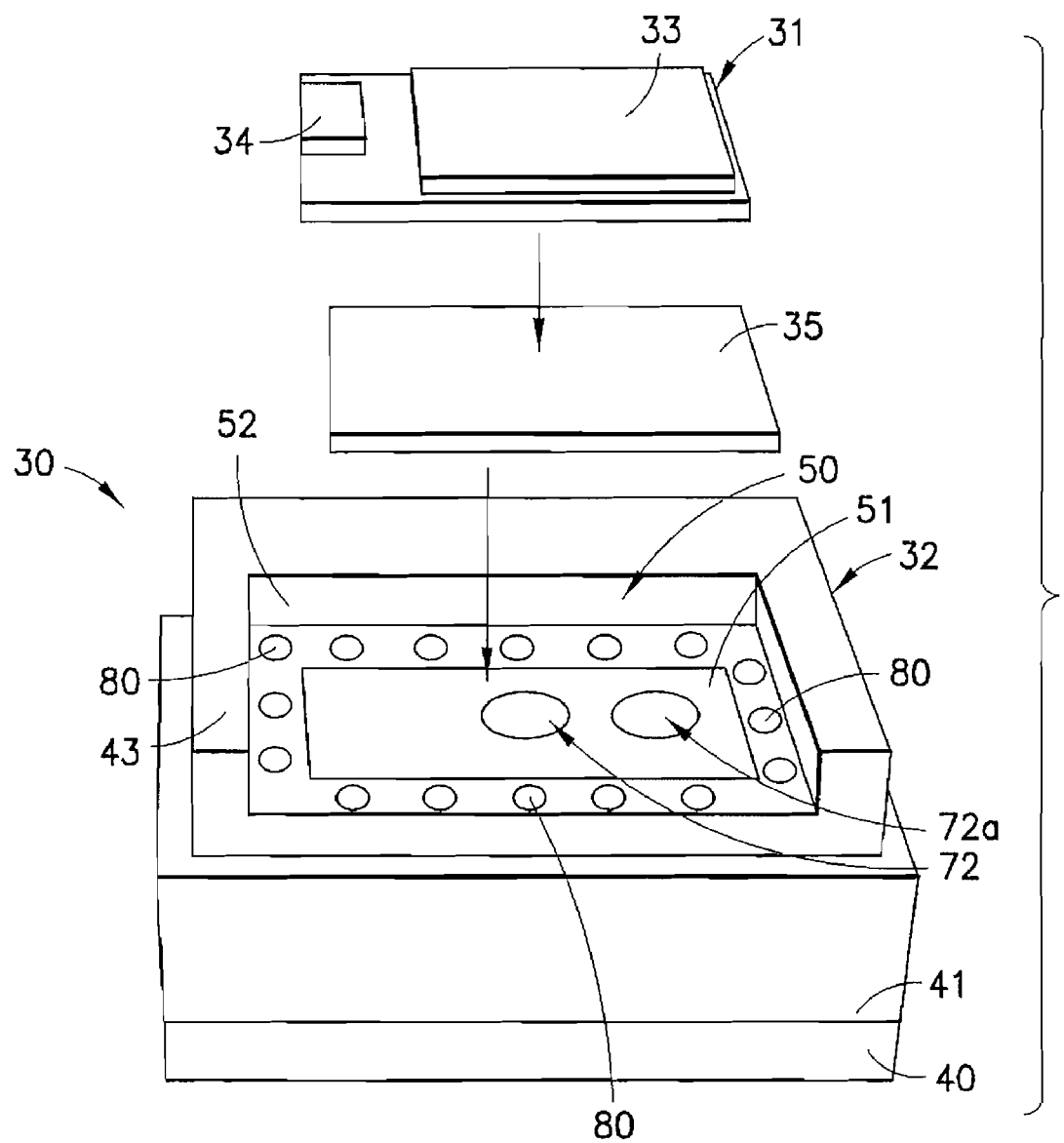
FIG. 11 is an exploded perspective of the package of FIG. 9 with plural resistive shunt vias in the DBC wafer.

Referring next to FIGS. 9, 10 and 11, there is shown a solder stop structure which securely locates the die 31 on surface 51 of device or package 70 of FIG. 8 during die attach and prevents the die edge from contacting the frame 52. Thus, a plurality of depressions or dimples 80 are formed around the desired location of die 31 to self-align the die during the die attach reflow process. Dimples 80 preferably have the rounded bottom shape reaching down to the ceramic 41.

It is also possible to use an isolating lacquer or other solder stop inside the frame 52. A "smooth solder" process may be used, using the preform 35 as shown rather than a solder paste with flux, which can also be used. When using the solder preform 35; the solder process can be carried out in forming gas atmosphere to avoid strong movement of the die inside the DBC can during the soldering process. However, dimples 80 will act as solder stops and also provide stress release inside the can for the bond force between the copper and the ceramic during temperature cycling.

Figure 12:
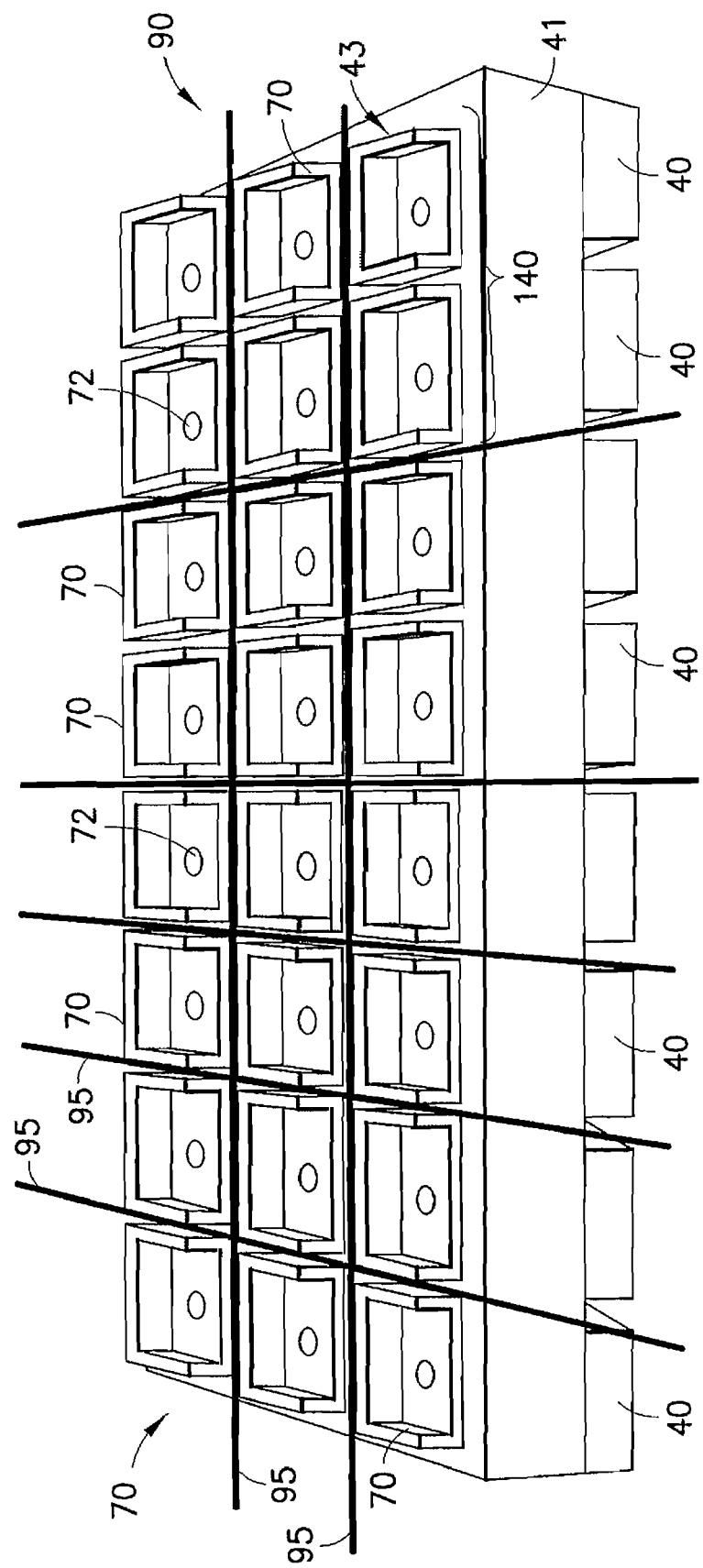
FIG. 12 shows a DBC card in which the packages of the invention can be processed in wafer scale and can be singulated individually or in selected groups.

In order to minimize package costs, the individual packages 70 of FIG. 8 (or 30 of FIG. 1) can be formed simultaneously on a DBC card and then singulated from the card. Thus, a DBC card 90 is shown in FIG. 12. Such cards are produced in sizes such as 5"×7" or 4"×6" and have a continuous central ceramic layer 41 with top and bottom copper layers. These layers can be simultaneously masked and etched to define the individual packages 70 (or 30) with the depressions 52 in the top layer as in the prior figures; and with other features such as the shunts 72 and dimples 80 (FIGS. 9 and 10). After the patterning of the packages and the streets 95 between the packages, various die 31 can be loaded into the packages locations. Note that the shunts can be tested before die 31 are assembled and soldered in place, and each package can be tested before singulation of the packages. Further, the die loaded into the packages may be diverse die such as combination of MOSFETs, IGBTs, diodes and the like.

It is very desirable to test the shunt 72 values before any silicon or other die is mounted in the respective package to reduce yield loss. After tests are carried out at wafer level, the DBC cans can be singulated by sawing, dicing or physically breaking at the streets 95.

Note that the packages can be singulated in clusters of two or more packages. Two package clusters are shown on the right hand half of FIG. 12 and may be mounted as will be described in connection with FIG. 14.

Note also that vias may be omitted in selected package locations on the card 12, and in selected ones of a cluster of packages.

The formation of the packages on card 90 has benefits in connection with the shipment of packages to a customer. Thus, the cards can be shipped to a customer intact and singulated by the user at the user's site. The cards can be protected by a suitable foil for shipment and can be prescribed for easy break-off or singulation of packages by the end user.

FIGS. 13, 14, 15, 16, 17, 18, 19, 20, 21 and 22 show various applications of packages 30 and 70 in multidevice packages including their the inclusion of integrated circuits for current control.

Figure 13:
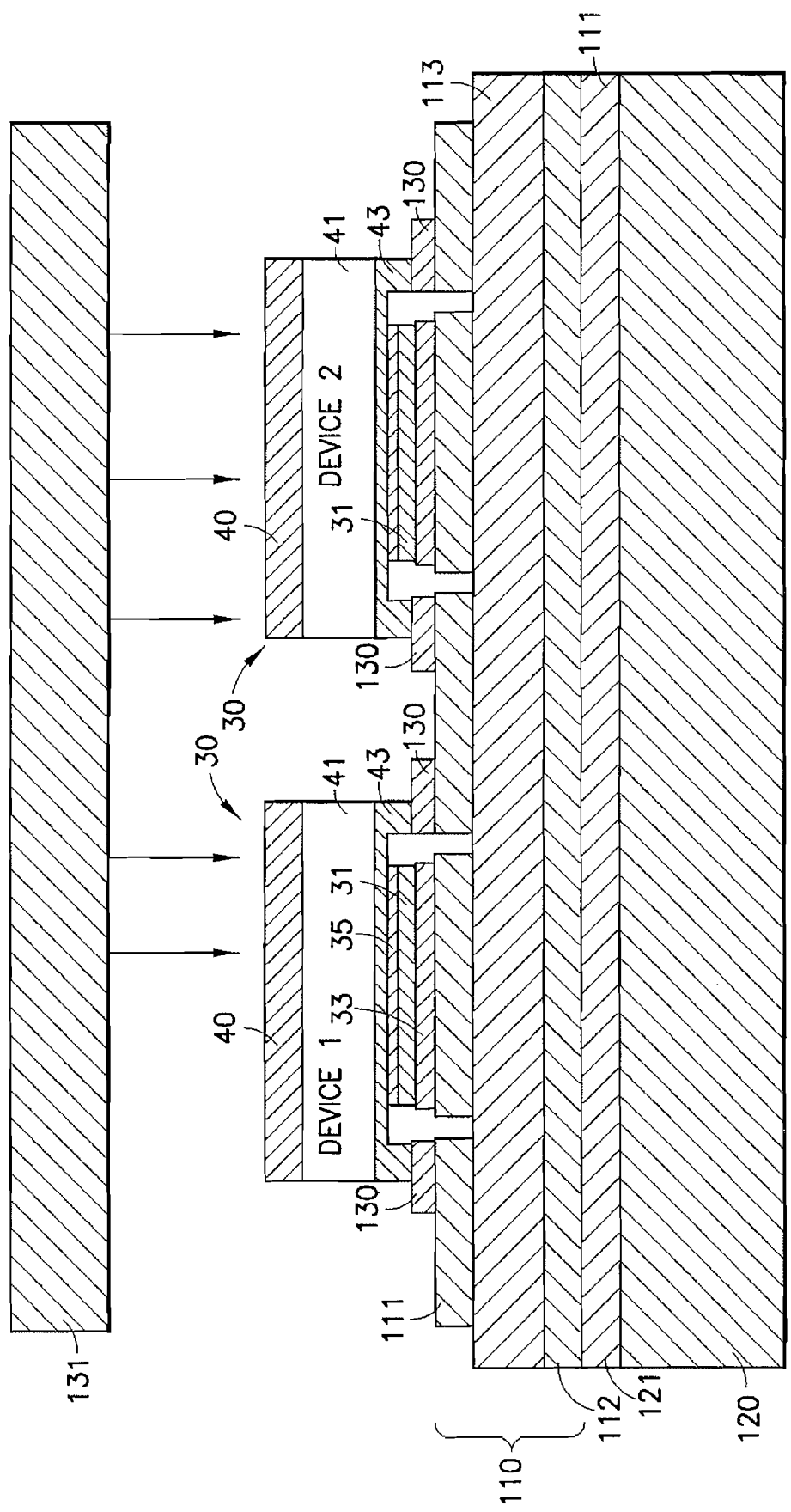
FIG. 13 shows an assembly of plural packages on a common heat sink with an upper heat sink as well.

Referring first to FIG. 13, there is shown a bottom DBC substrate 110 having an upper patterned conductive layer 111, a bottom conductive layer 112 and a thermally conductive ceramic insulation layer 113. The bottom conductive layer 112 of DBC support 110 may be soldered by solder 121 or otherwise adhesively connected to a massive heat sink 120 which may be a water cooled massive copper block. The ceramic layer 113 electrically insulates the patterned conductive layer 111 from heat sink 120. Note that DBC 110 can be replaced by an IMS (Insulated Metal Substrate) structure.

The conductive pattern 111 on DBC 110 receives packages 30 as shown. The conductors 43 are soldered to pattern 111 by solder layers 130 and source bumps 33 are soldered to the pattern as shown. The gate bumps are soldered to insulated patterned lands on pattern 111 in locations not seen in FIG. 13. The pattern 111 then interconnects the two packages 30 as desired to define the desired circuit, such as a half bridge or the like.

A further conductive heat sink or plate 131 may be attached by solder or a conductive adhesive glue to the conductive segments of devices 30 to provide additional double-sided cooling for devices 30. The conductive plate 131 is electrically insulated from devices 30 by the insulation layers 31.

Figure 14:
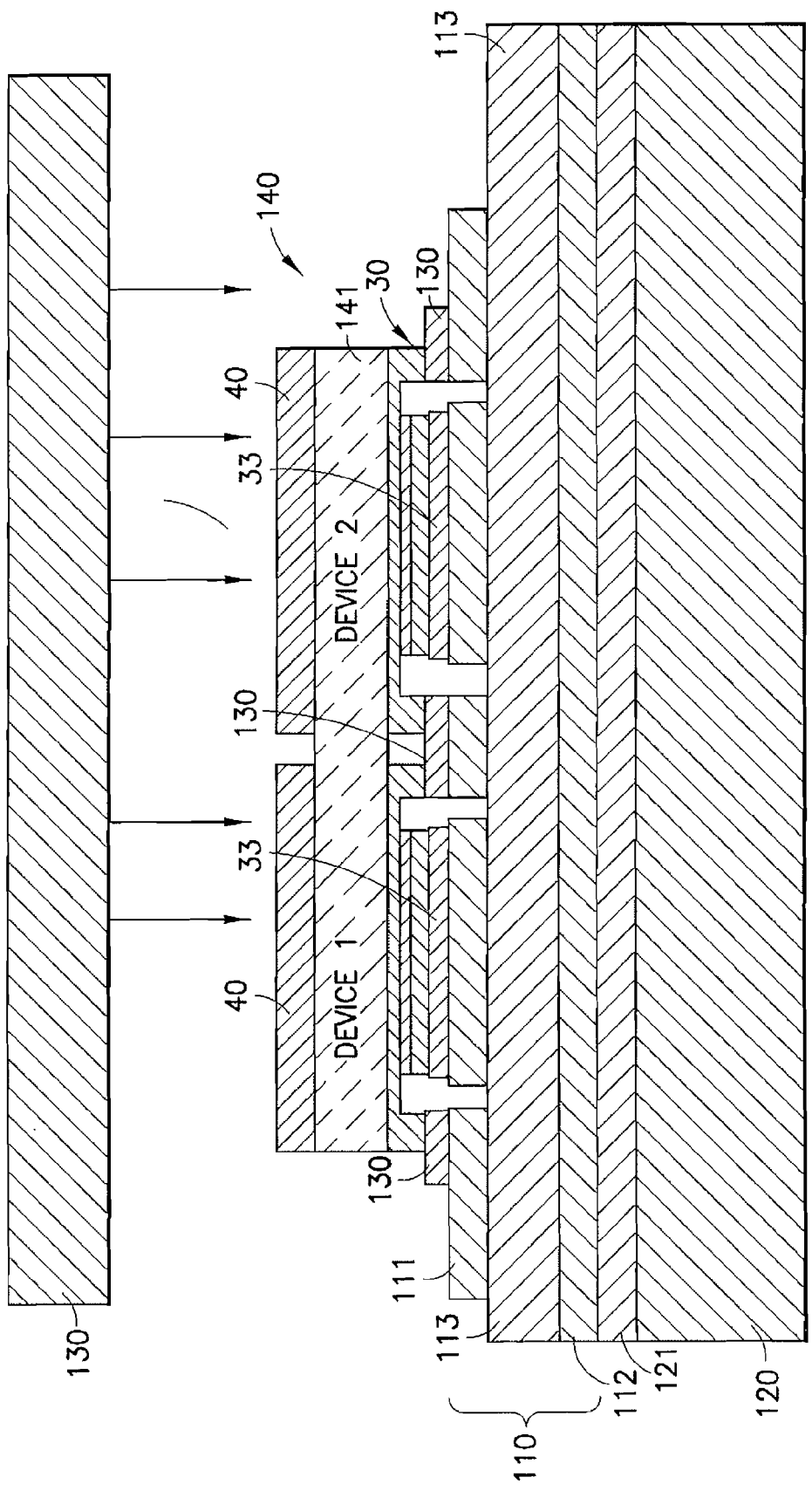
FIG. 14 shows a assembly like that of FIG. 13 in which adjacent packages share a common central insulation layer of the DBC.

FIG. 14 shows an assembly like that of FIG. 13, where however, a cluster 140 of two devices 30 with a common ceramic layer 141 are mounted on patterned conductor 111. The cluster 140 may be that shown, for example, in FIG. 12 at the bottom right of the Figure, with or without the shunts 72.

Figure 15:
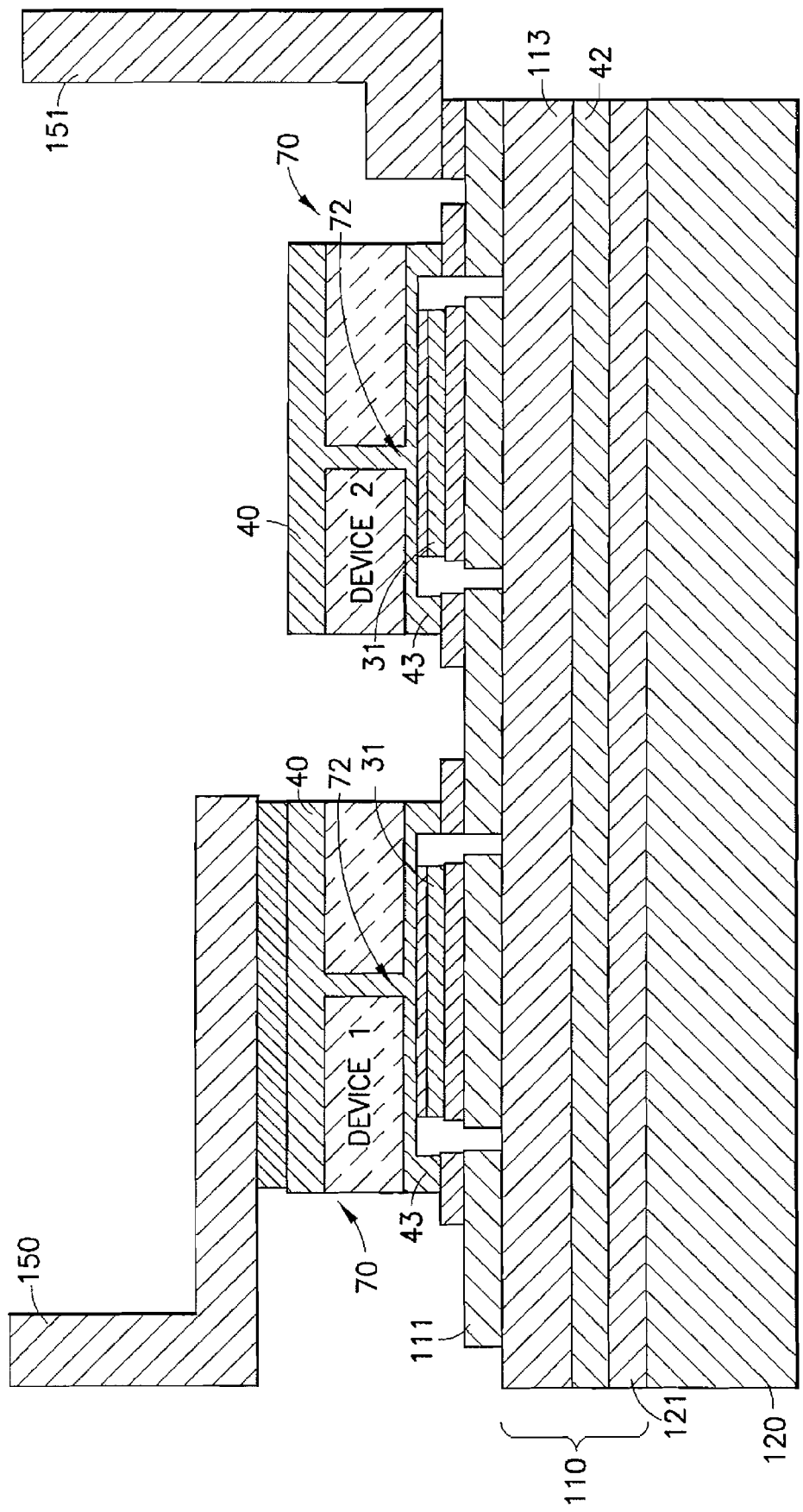
FIG. 15 shows an assembly of at least two packages with resistive via shunts and with metal interface terminals for the package.

FIG. 15 shows the assembly of devices 70 of FIG. 8 with shunts 72 mounted in the manner of FIG. 13 for devices 30. FIG. 15 shows the use of an external bus bar or lead frame including terminals 150 and 151 connected to copper layer 40 of left hand device 70 and to the patterned conductor 11 respectively. Terminals 150 and 151 can provide terminals for connection to external circuits and terminal 150 can form a second level of circuitry for mounting DC bus capacitors or other components needed for switching applications such as inverters and the like. Terminals 150 and 151 can be angled as desired or can be straight conductors and extend out beyond the boundary of the DBC 110. Smaller signal connectors may also be provided for connecting the gates of devices 31 to a driver IC or to establish connections to sensors such as temperature, voltage and current sensors on the patterned conductor 111.

Figure 16:
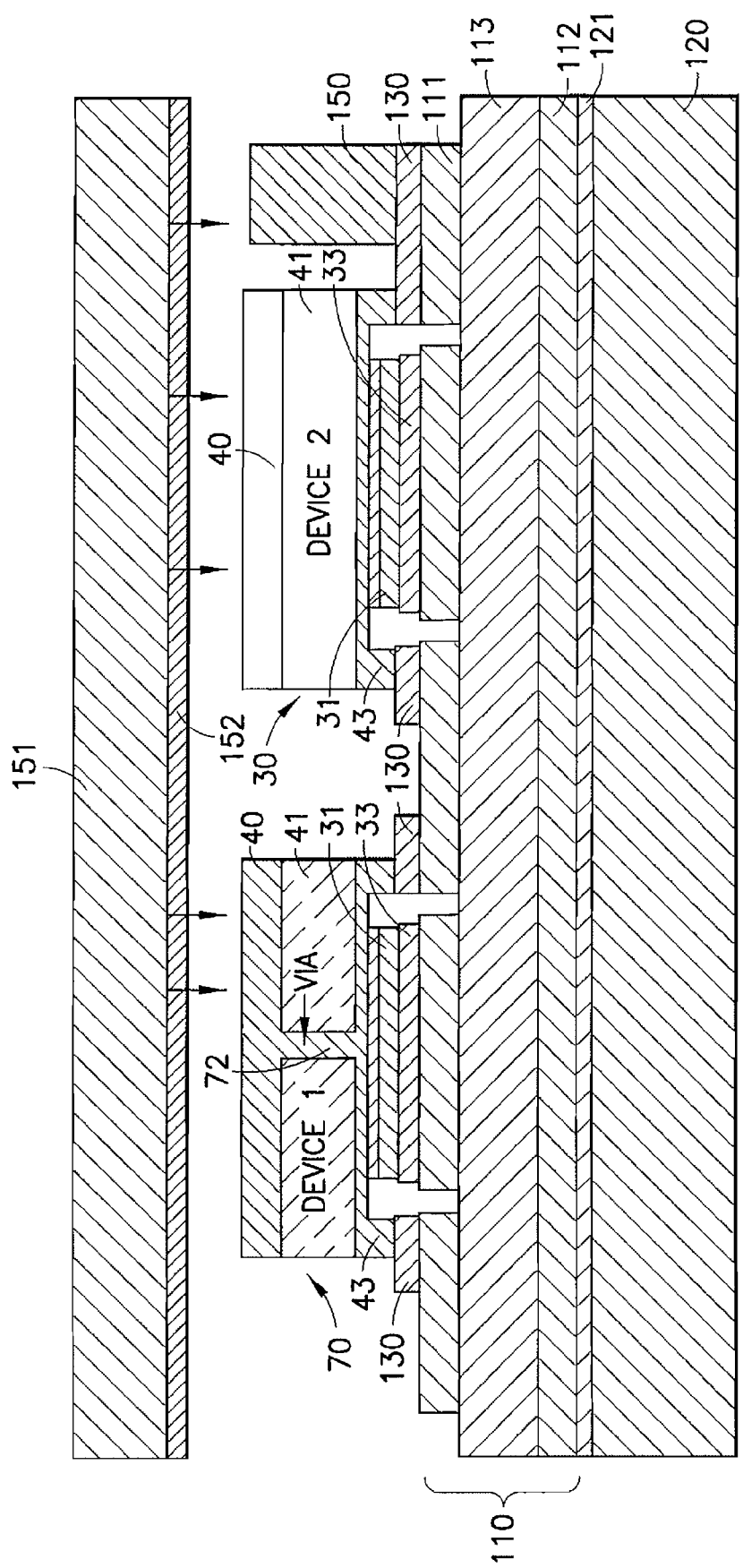
FIG. 16 shows an assembly similar to that of FIG. 13 in which an EMI screening plate is atop the package and one device has a resistive shunt.

FIG. 16 shows an assembly like that of FIGS. 13 and 15 in which devices 70 and 30 are mounted on DBC 110. FIG. 16 also shows an added copper contact 150 and a metal plate 151 with a solder layer 152 to solder the plate 151 to conductors 40 and 150, and thus to patterned conductor 111. Plate 151 acts as an EMI screening plate reducing the need for an additional EMI filter network which is important in automotive applications. Plate 151 also acts as an upper heat sink to packages 30 and 70.

Figure 17:
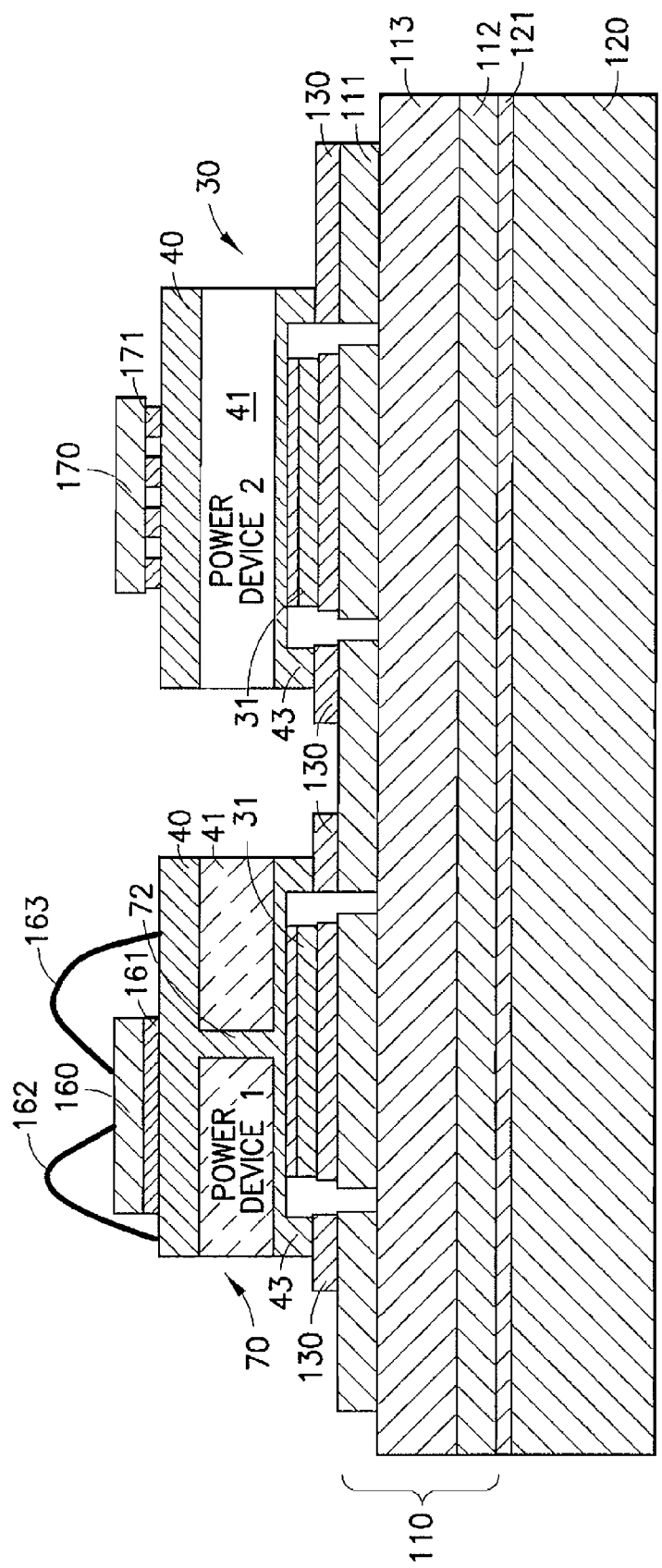
FIG. 17 shows an assembly like that of FIG. 16 with control integrated circuits (ICs) mounted atop the individual devices.

FIG. 17 shows the package of FIG. 16, in which a schematically shown IC die 160 is mounted atop device 70 as by solder 161 and is wire bonded to the die 31 in device 70 by wire bonds 162, 163 over conductive traces (not shown). Another control IC die 170 having ball contacts 171 is mounted atop device 30 and is connected to die 131 by traces, again not shown. ICs 160 and 170 may be of any desired type such as gate drivers, motor drivers, motion control ICs, I/O communication ICs and the like, up to microcontroller functions. The trace connections can be formed by vias through insulation layers 41. More specifically, IC die 160 is backside soldered to conductor 40 by solder 161 and are then wire bonded to the die 31. Bare IC 170 is flip-chip soldered to the top of device 30 which will have a suitable structured pattern to match the ball grid array of IC 170.

Figure 18:
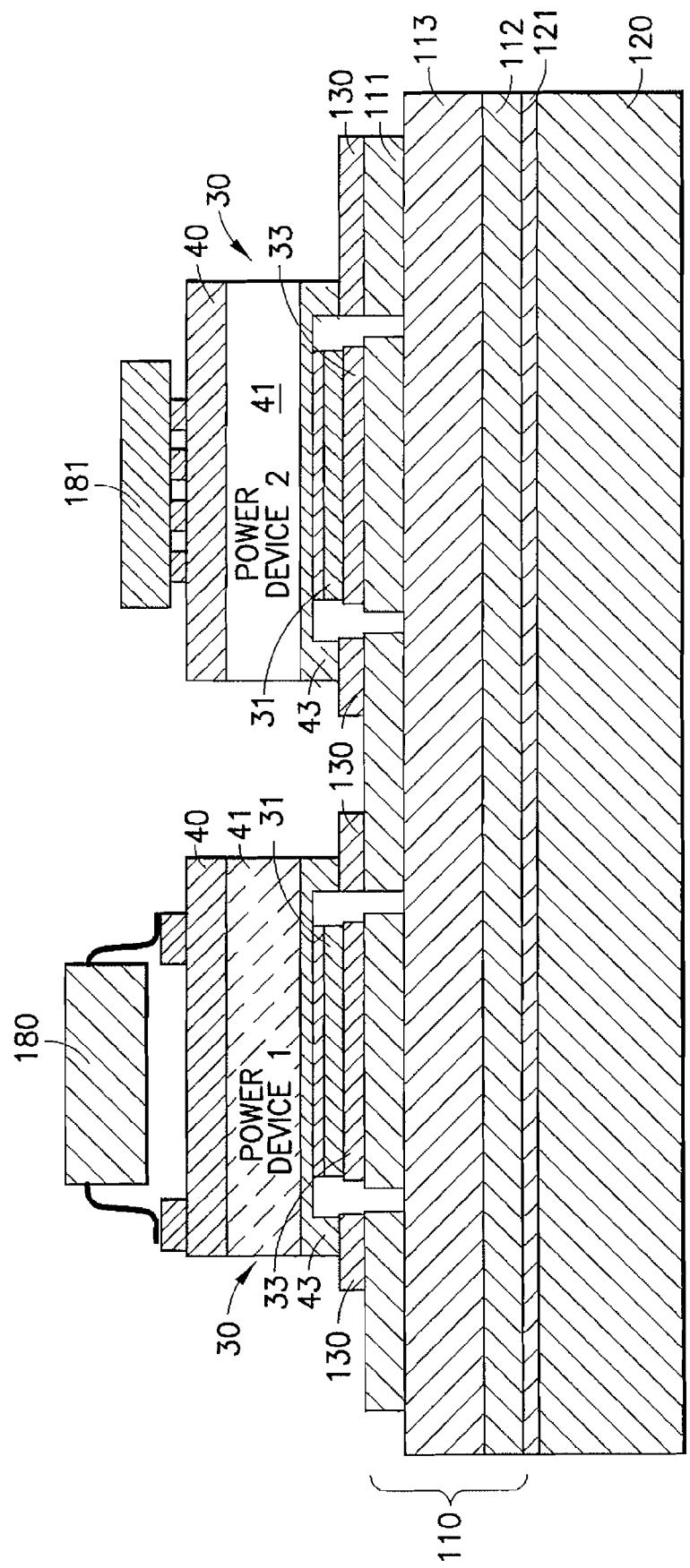
FIG. 18 shows an assembly with packaged ICs fixed to the tops of the power devices.

FIG. 18 shows an assembly like that of FIG. 17 with two devices 30 in which prepackaged ICs 180 and 181 are used instead of the bare die 160 and 170 respectively in FIG. 17. Via feed thrus, not shown, can be used to make connections to the die 31 from ICs 180 and 181.

Figure 19:
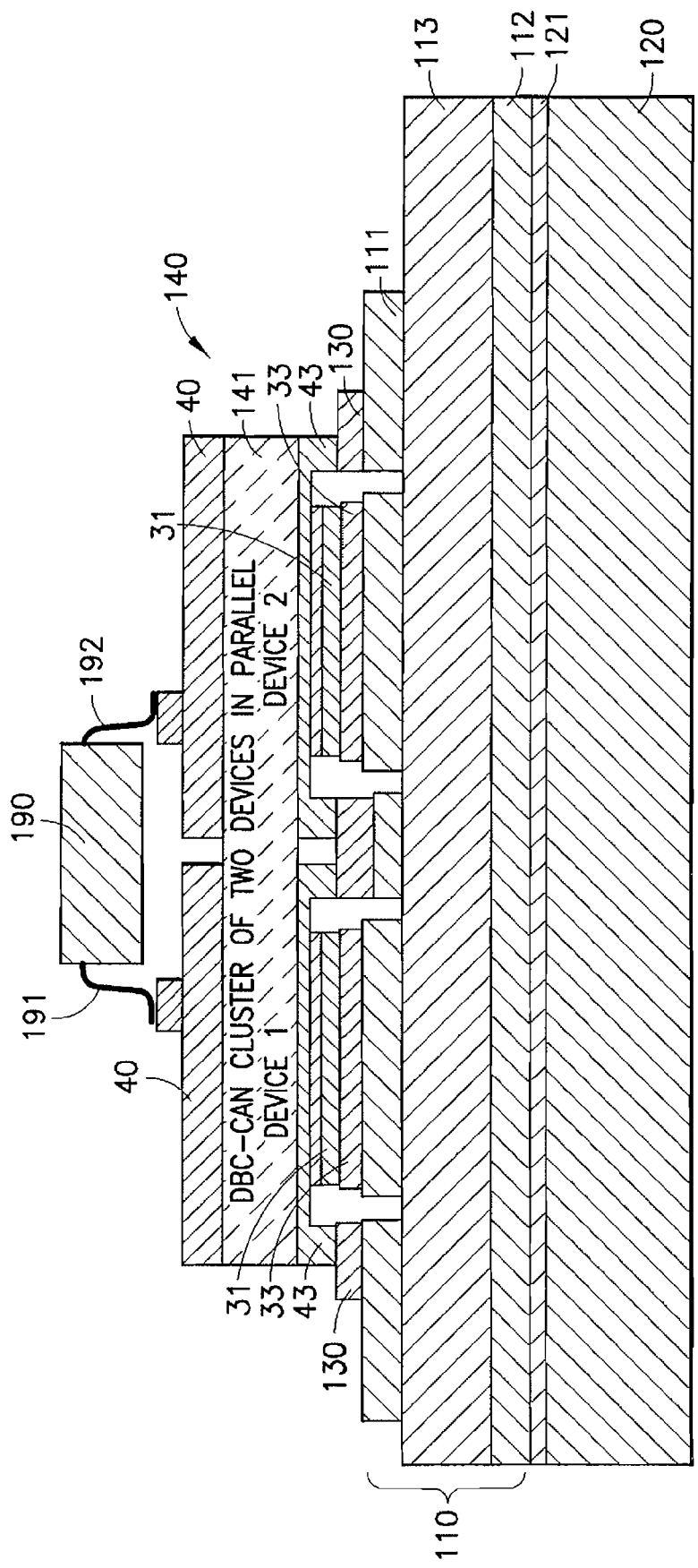
FIG. 19 shows a still further assembly of the novel packages of the invention with an IC common to the two devices.

FIG. 19 shows the assembly of FIG. 14 with a packaged IC 190 soldered to the two DBC cans in composite 140. The surfaces of copper layers 40 will be suitably patterned to match and receive the plural IC terminals 191, 192 (only two shown).

Figure 20:
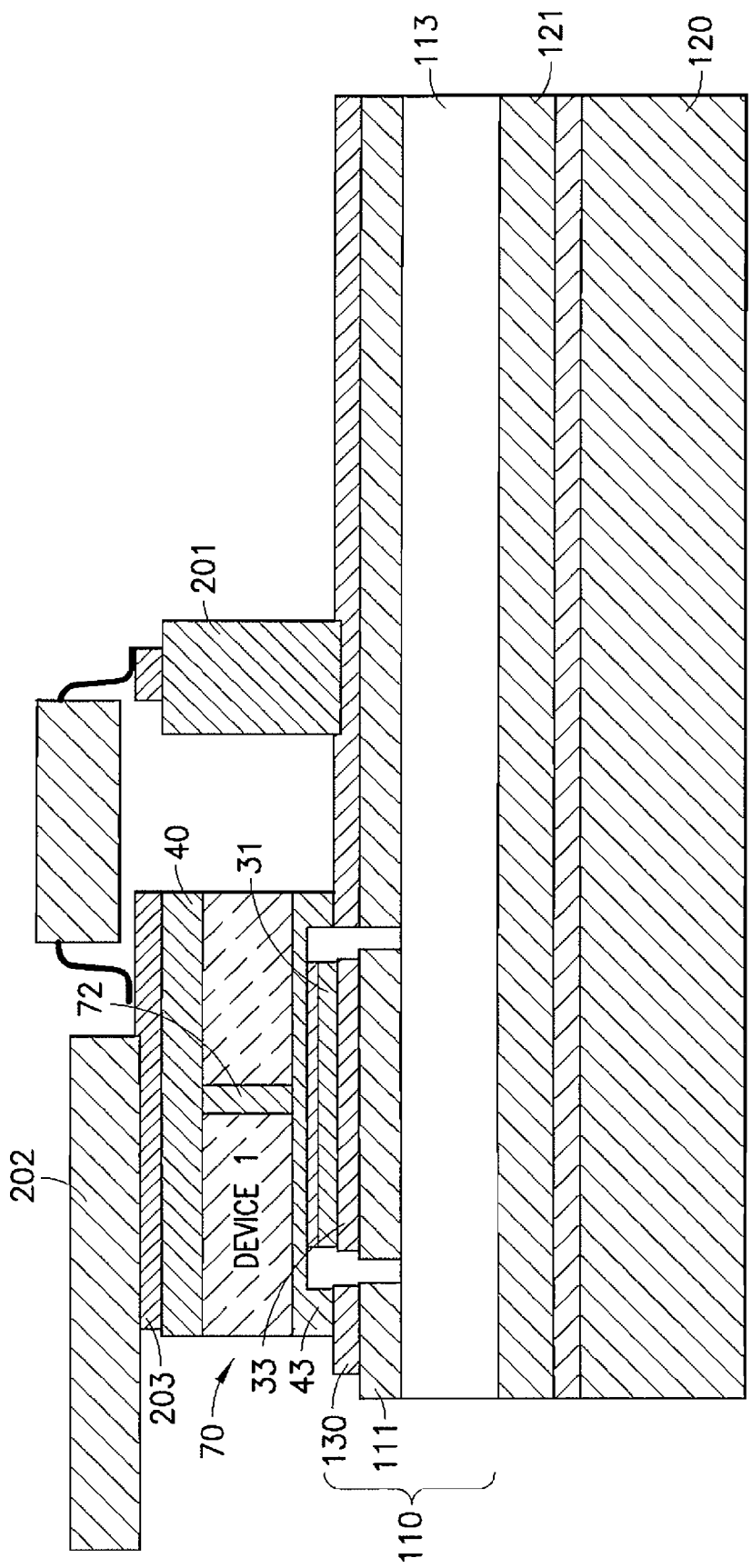
FIG. 20 shows a further assembly in which an IC contracts both the top and bottom contacts of a power device with a resistive via shunt.

FIG. 20 shows a device assembly for a single device 72 in which an IC 200 is connected to the patterned top of conductive layer 40 and to a conductor 201 which is connected to conductive pattern 111. An external interface terminal 202 is soldered to layer 40 by solder 203 and can receive other external elements. This arrangement permits the IC 200 to measure the voltage drop on shunt 72 and feed and control a suitable predictive circuit, not shown.

Figure 21:
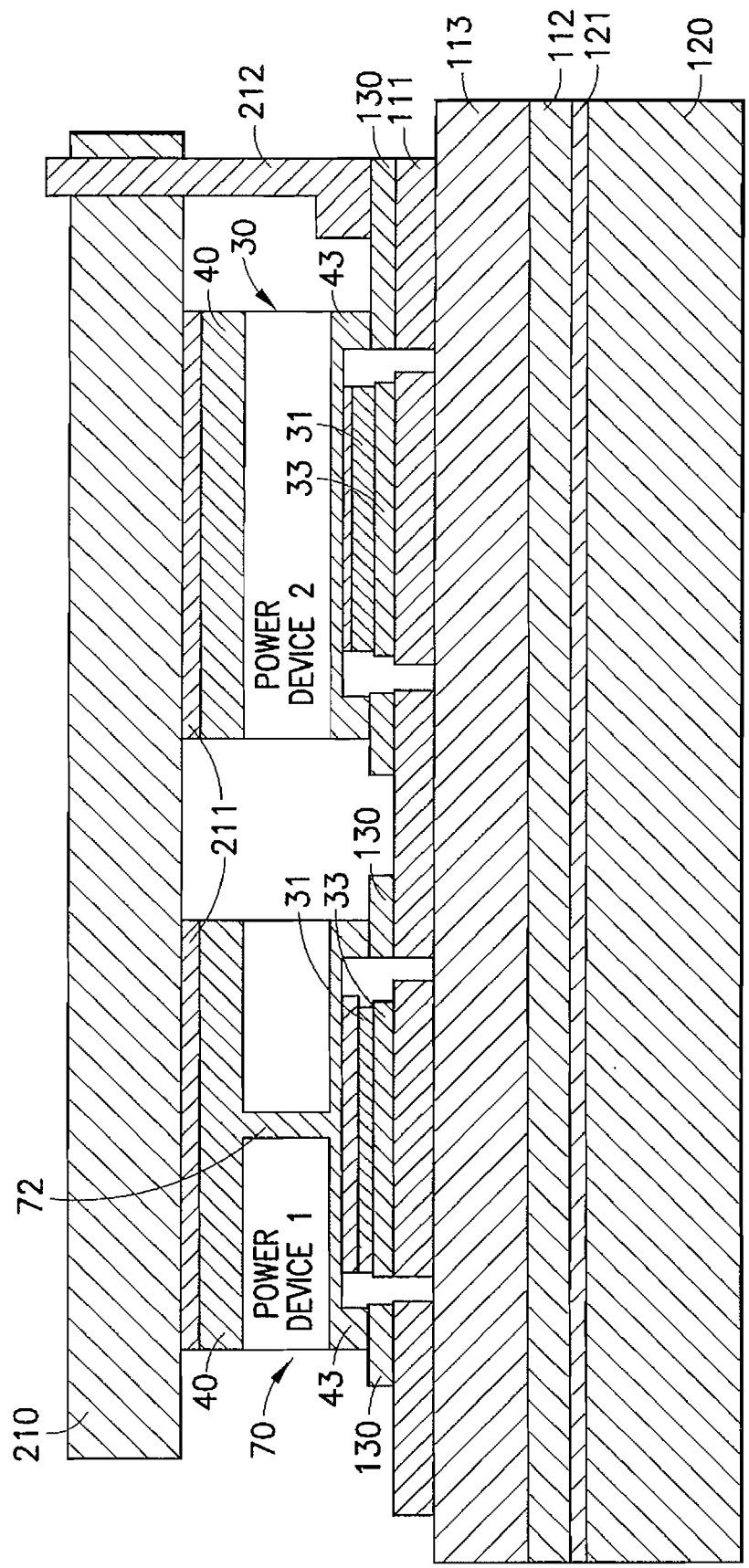
FIG. 21 shows a novel assembly of the invention with a circuit board mounted atop and connected to the power devices.

FIG. 21 shows the structure of FIG. 17 in which a circuit 210 board containing active passive components for control of the power devices 31 fixed atop conductors 40 by solder or adhesive glue 211 and electrically connected to pads (not shown) layers 40 to analyze the currents and voltages in die 31 and initiate suitable control functions. A contact 212 soldered to pattern 111 is also connected to the smart board 210.

Figure 22:
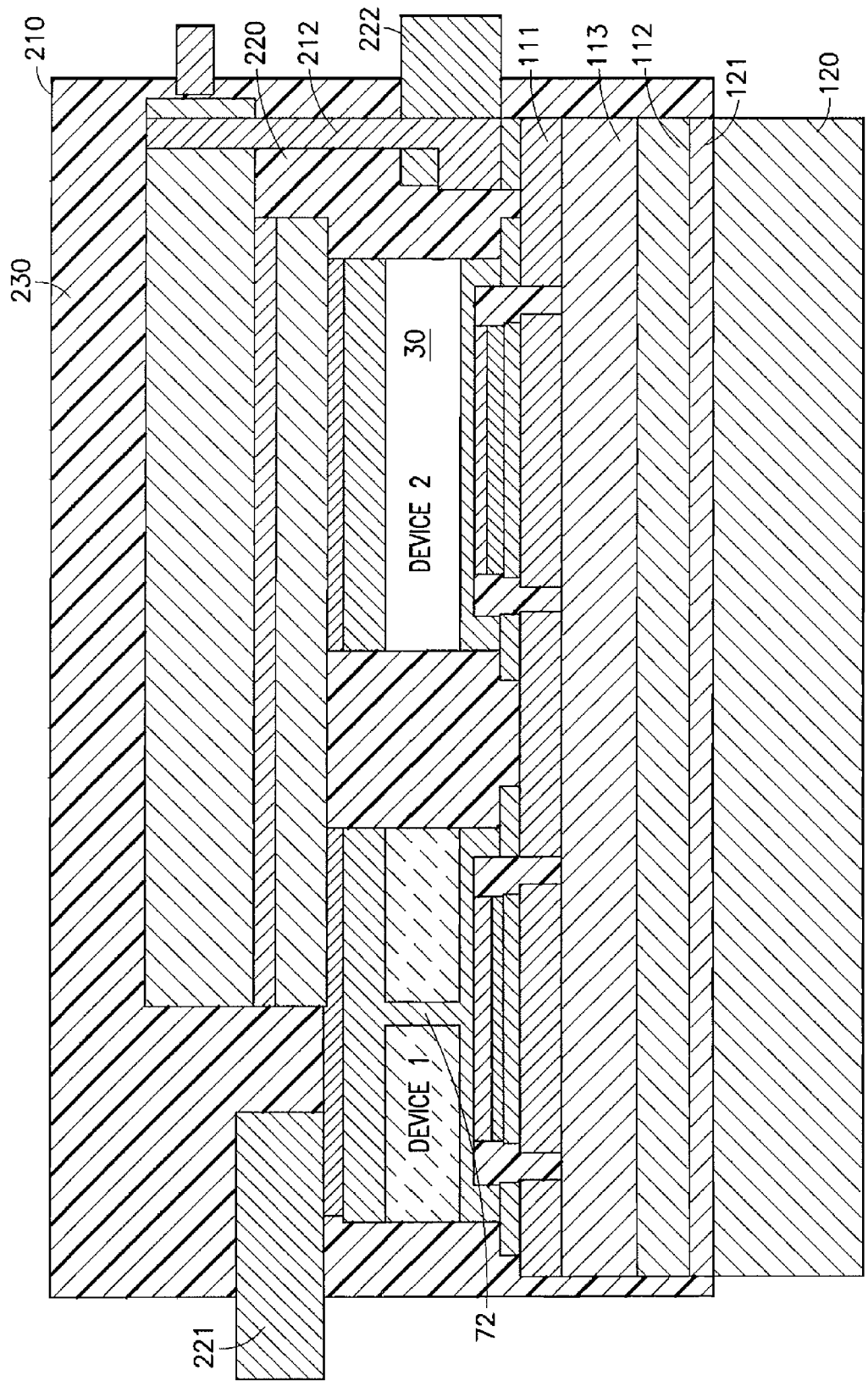
FIG. 22 shows a novel assembly in accordance with the invention with an EMI screen, a "smart" circuit board and a plastic molded body.

FIG. 22 shows an assembly like that of FIG. 21 in which an EMI screening plate 220 is added as shown, and external power terminals 221, 222 are also added.

Significantly, a mold compound 230 is added to encapsulate the package. A similar mold compound can be applied to the other assemblies previously described.

Although the present invention has been described in relation to particular embodiments thereof, many other variations and modifications and other uses will become apparent to those skilled in the art. It is preferred, therefore, that the present invention be limited not by the specific disclosure herein.

What is claimed is:

1. A wafer scale package comprising:
   a plurality of laterally spaced semiconductor packages separated by separation streets;
   each of said semiconductor packages comprising a semiconductor die having first and second parallel surfaces and a support can;
   said support can comprising an insulation body having top and bottom parallel surfaces with corresponding top and bottom conductive layers;
   said top conductive layer having a depression therein defining a web surface and an upstanding rim portion extending around at least a portion of the periphery said web surface;
   said die being disposed in said depression, said insulation body being severable in said separation streets to separate said semiconductor packages from one another.

2. The wafer scale package of claim 1, wherein said semiconductor die for each of said semiconductor packages is a silicon MOSgated device.

3. The wafer scale package of claim 1 further comprising an electrode on said second parallel surface of said semiconductor die, said electrode being mechanically and electrically fixed to said web surface.

4. The wafer scale package of claim 3, wherein said electrode is a source or a drain electrode of a silicon MOSgated device.

5. The wafer scale package of claim 4, wherein said electrode is a bump contact.

6. A wafer scale package comprising:
   a plurality of laterally spaced semiconductor packages separated by separation streets;

each of said semiconductor packages comprising a semiconductor die having first and second surfaces and first and second electrodes on each of said first and second surfaces, respectively, and a support can for supporting said semiconductor die;

said support can comprising an insulation body having top and bottom parallel surfaces and top and bottom conductive layers on said top and bottom surfaces respectively;

said top conductive layer having a depression therein defining a web surface and a rim portion, said die being disposed in said depression with said second electrode mechanically and electrically fixed to said web surface;

said insulation body being severable in said separation streets to separate said semiconductor packages from one another.

7. The wafer scale package of claim 6, wherein said semiconductor die for each of said semiconductor packages is a silicon MOSgated device.

8. The wafer scale package of claim 6, wherein said second electrode is a source or a drain electrode of a silicon MOSgated device.

9. The wafer scale package of claim 6, wherein said first electrode is a bump contact.

10. The wafer scale package of claim 6, wherein said second electrode is a bump contact.

11. The wafer scale package of claim 6, wherein said rim portion has a general U shape.

* * * * *